US009638845B2

(12) United States Patent
Song (10) Patent No.: US 9,638,845 B2
(45) Date of Patent: May 2, 2017

(54) UV MASK AND FABRICATION METHOD THEREOF (71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Sung Hun Song, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 43 days.

(21) Appl. No.: 14/422,532

(22) PCT Filed: Jun. 26, 2013

(86) PCT No.: PCT/CN2013/077946
§ 371 (c)(1),
(2) Date: Feb. 19, 2015

(87) PCT Pub. No.: WO2014/153879
PCT Pub. Date: Oct. 2, 2014

(65) Prior Publication Data
US 2015/0226891 A1  Aug. 13, 2015

(30) Foreign Application Priority Data

Mar. 25, 2013  (CN) .......................... 2013 1 0097951

(51) Int. Cl.
G03F 1/54 (2012.01)
G03F 1/56 (2012.01)
(Continued)

(52) U.S. Cl.
CPC ............... *G02B 5/208* (2013.01); *G02B 1/10* (2013.01); *G02F 1/133512* (2013.01);
(Continued)

(58) Field of Classification Search
CPC ..... G03F 1/54; G03F 1/56; G03F 1/58; G02F 1/339; G02F 2001/133388; H01L 27/1288; H01L 27/124; G02B 5/208
(Continued)

(56) References Cited

U.S. PATENT DOCUMENTS 3,951,709 A    4/1976  Jacob
5,700,606 A   12/1997  Kobayashi et al.
(Continued)

FOREIGN PATENT DOCUMENTS

CN         1867457     11/2006
CN      101196690 A    6/2008
(Continued)

OTHER PUBLICATIONS

Computer-generated translation of JP 2012-013840 (Jan. 2012).*
(Continued)

*Primary Examiner* — John A McPherson
(74) *Attorney, Agent, or Firm* — Ladas & Parry LLP (57) ABSTRACT A UV mask and a fabrication method thereof. The UV mask fabrication method includes: forming a UV shielding layer on a coverage area of a base substrate by using a color filter layer mask plate and a black matrix mask plate; or forming a UV shielding layer on the base substrate by using the color filter layer mask plate. In this way, the cost spent in manufacturing a display device by using a special mask plate (mask) to fabricate the UV mask is reduced.

11 Claims, 9 Drawing Sheets (51) Int. Cl.
<table>
<tr><td>G02B 5/20</td><td>(2006.01)</td></tr>
<tr><td>G03F 1/58</td><td>(2012.01)</td></tr>
<tr><td>G02F 1/1335</td><td>(2006.01)</td></tr>
<tr><td>G02B 1/10</td><td>(2015.01)</td></tr>
<tr><td>H01L 27/12</td><td>(2006.01)</td></tr>
<tr><td>H01L 29/786</td><td>(2006.01)</td></tr>
<tr><td>G02F 1/1333</td><td>(2006.01)</td></tr>
</table>

(52) U.S. Cl.
CPC ............... *G03F 1/54* (2013.01); *G03F 1/56* (2013.01); *G03F 1/58* (2013.01); *H01L 27/124* (2013.01); *H01L 27/1288* (2013.01); *H01L 29/78633* (2013.01); *G02F 1/133514* (2013.01); *G02F 2001/133388* (2013.01)

(58) Field of Classification Search
USPC ...................................... 430/5; 349/153, 190
See application file for complete search history.

(56) References Cited

U.S. PATENT DOCUMENTS

<table>
<tr><td>2002/0167634 A1</td><td>11/2002</td><td>Watanabe et al.</td></tr>
<tr><td>2006/0139507 A1</td><td>6/2006</td><td>Lin</td></tr>
<tr><td>2008/0117161 A1</td><td>5/2008</td><td>Hu</td></tr>
<tr><td>2013/0222746 A1</td><td>8/2013</td><td>Itoh et al.</td></tr>
<tr><td>2013/0233482 A1</td><td>9/2013</td><td>Chen et al.</td></tr>
<tr><td>2015/0146130 A1*</td><td>5/2015</td><td>Chen ................ G02F 1/133308 349/58</td></tr>
<tr><td>2015/0277226 A1*</td><td>10/2015</td><td>Liu .......................... G03F 1/38 216/23</td></tr>
</table>

FOREIGN PATENT DOCUMENTS

<table>
<tr><td>CN</td><td>101995762 A</td><td></td><td>3/2011</td></tr>
<tr><td>CN</td><td>102331637 A</td><td></td><td>1/2012</td></tr>
<tr><td>CN</td><td>102636917 A</td><td></td><td>8/2012</td></tr>
<tr><td>CN</td><td>102681264 A</td><td></td><td>9/2012</td></tr>
<tr><td>CN</td><td>102799018 A</td><td>*</td><td>11/2012</td></tr>
<tr><td>CN</td><td>103033975 A</td><td></td><td>4/2013</td></tr>
<tr><td>JP</td><td>01237660 A</td><td></td><td>9/1989</td></tr>
<tr><td>JP</td><td>2006-251611 A</td><td></td><td>9/2006</td></tr>
<tr><td>JP</td><td>2009-188047 A</td><td></td><td>8/2009</td></tr>
<tr><td>JP</td><td>2012-013840 A</td><td>*</td><td>1/2012</td></tr>
<tr><td>KR</td><td>20060056694 A</td><td></td><td>5/2006</td></tr>
</table>

OTHER PUBLICATIONS

International Preliminary Report on Patentability Appln. No. PCT/CN2013/077946; Dated Sep. 29, 2015.
International Search Report mailed Jan. 23, 2014; PCT/CN2013/077269.
First Chinese Office Action dated Sep. 3, 2014; Appln. No. 201310125028.3.
International Preliminary Report on Patentability issued Oct. 13, 2015; PCT/CN2013/077269.
USPTO NFOA dated Aug. 27, 2015 in connection with U.S. Appl. No. 14/361,763.
USPTO NFOA dated Feb. 25, 2016 in connection with U.S. Appl. No. 14/361,763.
USPTO FOA dated Aug. 26, 2016 in connection with U.S. Appl. No. 14/361,763.
First Chinese Office Action dated Mar. 3, 2017; Appln. No. 201310097951.0.
USPTO NFOA dated Mar. 10, 2017 in connection with U.S. Appl. No. 14/361,763.

* cited by examiner

UV MASK AND FABRICATION METHOD THEREOF

TECHNICAL FIELD

Embodiments of the present invention relate to a UV mask and the manufacturing method thereof.

BACKGROUND

Figure 1:
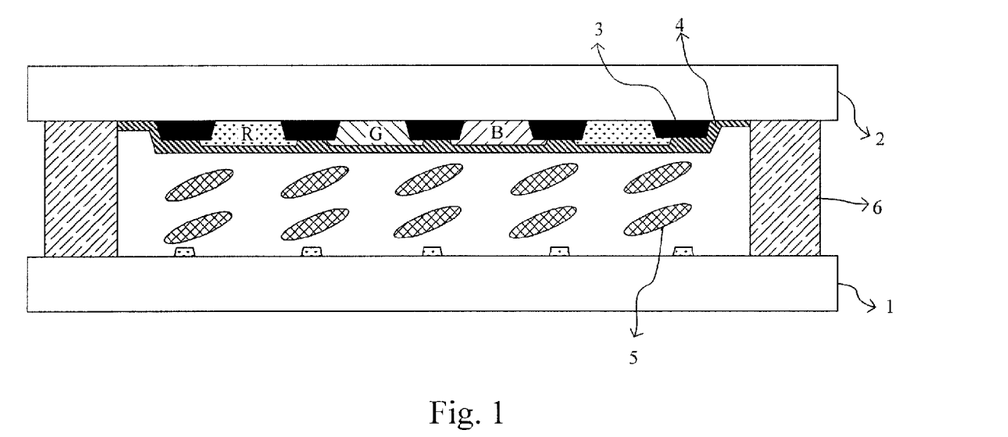
FIG. 1 is a vertical cross-section view of a common display panel.

A display device such as a liquid crystal display (LCD) is a commonly used flat panel display device. As shown in FIG. 1, a manufacturing method thereof generally includes: providing two parallel substrates (lower substrate 1 and upper substrate 2), coating a sealant 6 between the two parallel substrates, and injecting liquid crystal 5 in a space defined by the two parallel substrates 1 and 2 and the sealant 6. The lower substrate is provided with a thin film field effect transistor (TFT) and the upper substrate is provided with a color filter (CF). Rotation direction of a liquid crystal molecule in a liquid crystal cell is controlled by a signal change and a voltage change applied to the TFT so as to control exiting of polarized light of each pixel point, hence realizing the displaying. At present, methods for curing the sealant in the industry are mainly classified into two types: thermocuring and ultraviolet light (UV) curing.

There are two ways for injecting the liquid crystal into the space defined by the sealant and the two substrates: the first one is an injection method in which the lower and upper substrates are firstly bonded by a sealant, one or more liquid crystal injection openings are provided in the sealant, then the liquid crystal is injected into the space between the two substrates via the liquid crystal injection openings by means of the gas pressure difference between atmosphere and vacuum under vacuum environment; the other is a one drop fill method in which the sealant is firstly coated on one substrate, the liquid crystal is distributed in the space defined by the sealant and the aforementioned substrate by a liquid crystal drop filling device, then another substrate is cell-assembled with the aforementioned substrate under vacuum environment and these two substrates are bonded firmly by curing the sealant. Since the latter way has a fast manufacturing speed and the liquid crystal material can be greatly saved, it has been mainly used in the industry recently for filling the liquid crystal.

Figure 2:
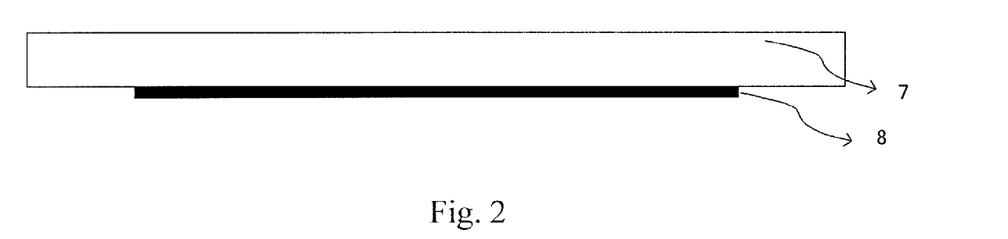
FIG. 2 is a structural schematic view of a common UV mask in prior art.

While using the latter liquid crystal filling method, the sealant may contact the liquid crystal before curing the sealant, therefore UV curing is generally utilized to prevent contamination of the liquid crystal caused by directly contacting between the liquid crystal and the sealant. The so-called UV curing is generally to shield a liquid crystal region (also known as an effective display region, namely A/A region) by a shield (a mask) so as to expose regions coated with the sealant to perform the UV curing to the sealant with a UV curing equipment, and the mask is generally called a UV mask. FIG. 2 shows a structural schematic view of a current UV mask in prior art, a UV mask 8 is fabricated from opaque metal (generally gate metal or data metal) on a base substrate 7 by deposition, masking, etching, photoresist stripping (PR strip).

In general, while fabricating a LCD, in addition to a mask for a TFT (array) substrate and a mask for a CF (color filter) substrate, an additional special mask is required to fabricate the UV mask, so the fabrication cost of the display device will be increased.

SUMMARY

Embodiments of the present invention provide a UV mask and a fabricating method thereof to solve the high manufacturing cost issue of a display device caused by a special mask used to manufacture the UV mask.

An embodiment of the present invention provides a manufacturing method of a UV mask, the UV mask used for UV curing a sealant in a display panel, and the method comprises: forming a UV light-shielding layer on a covering region of a base substrate by using a color filter layer mask and a black matrix mask; or, forming a UV light-shielding layer on the base substrate by the color filter layer mask.

Alternatively, the covering region of the base substrate is configured to include a display region corresponding to an effective display region in the display panel and an edge region surrounding the display region; a boundary line of the edge region that is close to the display region coincides with a boundary line of the display region, and under a case in that the display region is positioned to align with the effective region of the display panel, the edge region is positioned between the effective display region of the display panel and the sealant.

In some examples, the forming the UV light-shielding layer on a covering region of a base substrate by using a color filter layer mask and a black matrix mask comprises: forming a pattern of a first UV light-shielding layer, wherein the pattern of the first UV light-shielding layer is formed on the base substrate by using the black matrix mask, and the pattern of the first UV light-shielding layer comprises a pattern corresponding to the black matrix in the display region and a pattern of the edge region; forming a pattern of a second UV light-shielding layer, wherein the second UV light-shielding layer is formed on the base substrate by a red color filter layer mask, a green color filter layer mask and a blue color filter layer mask, and the pattern of the second UV light-shielding layer comprises patterns of a red pixel region, a green pixel region and a blue pixel region.

Alternatively, the manufacturing method further comprises: dividing the covering region of the base substrate into the display region and the edge region; dividing the display region into the black matrix region and the pixel region; dividing the pixel region into the red pixel region, the green pixel region and the blue pixel region, wherein the black matrix region, the red pixel region, the green pixel region and the blue pixel region have a same arrangement structure as that of the black matrix region, a red pixel region, a green pixel region and a blue pixel region on a color filter substrate of the display panel.

In some examples, the forming the UV light-shielding layer on the base substrate by a color filter layer mask comprises: forming a pattern of a first UV light-shielding layer, wherein a pattern of a first region, a pattern of a second region and a pattern of a third region are formed on the covering region of the base substrate by at least one of a red color filter layer mask, a green color filter layer mask and a blue color filter layer mask; forming a pattern of a second UV light-shielding layer, wherein the second UV light-shielding layer is formed in gaps between the pattern of the first region, the pattern of the second region and the pattern of the third region on the base substrate by the red color filter layer mask or the green color filter layer mask or the blue color filter layer mask.

Alternatively, the manufacturing method further comprises: dividing the covering region of the base substrate into a plurality of sub-regions arranged along a gate line direction of the display panel, and dividing each of the sub-regions into a first region, a second region and a third region arranged in order along the gate line direction.

Alternatively, the forming a pattern of a second UV light-shielding layer in gaps between the pattern of the first region, the pattern of the second region and the pattern of the third region on the base substrate by the red color filter layer mask or the green color filter layer mask or the blue color filter layer mask comprises: by taking a position during forming the pattern of the first UV light-shielding layer as a reference position, after moving the red color filter layer mask or the green color filter layer mask or the blue color filter layer mask along the gate line direction of the display panel by a predetermined distance D, the pattern of the second UV light-shielding layer is formed in the gaps between the pattern of the first region, the pattern of the second region and the pattern of the third region.

Alternatively, the predetermined distance is a half of a pitch between the pattern of the first region, the pattern of the second region and the pattern of the third region along the gate line direction.

Alternatively, the forming a UV light-shielding layer on the base substrate by the color filter layer mask comprises: forming a pattern of a first UV light-shielding layer on the base substrate by using at least one of a red color filter layer mask, a green color filter layer mask and a blue color filter layer mask, the pattern of the first UV light-shielding layer including a pattern of a first region, a pattern of a second region and a pattern of a third region, wherein during forming the pattern of the first UV light-shielding layer, parameters of an exposure process are adjusted such that the pattern of the first region, the pattern of the second region and the pattern of the third region are joined seamlessly.

Alternatively, the pattern of the first region, the pattern of the second region and the pattern of the third region have equal or unequal distances along the gate line direction.

Alternatively, the UV light-shielding layer is made of opaque resin or opaque metal material.

Alternatively, an overcoat layer is formed on an entire surface of the base substrate to cover and protect the UV light-shielding layer.

An embodiment of the present invention provides a UV mask for UV curing a sealant in a display panel, the UV mask comprising a base substrate and a UV light-shielding layer formed on a covering region of the base substrate, a covering region of the base substrate is designed to comprise a display region which has the same size of the effective display region in a display panel and an edge region M surrounding the display region. A boundary line of the edge region M that is close to the display region coincides with a boundary line of the display region and when the display region is positioned to align with the effective display region in the display panel, the edge region is positioned between the effective display region of the display panel and the sealant. The UV light-shielding layer is formed on the base substrate by a color filter layer mask and a black matrix mask or by the color filter layer mask

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 3:
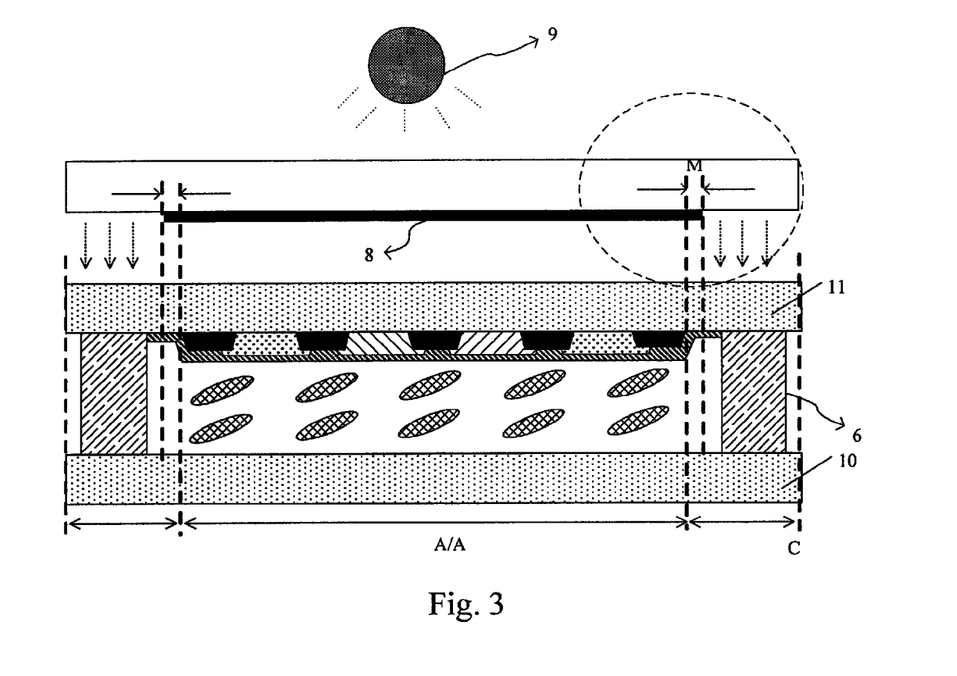
FIG. 3 is a schematic diagram of a sealant curing.

During a curing process of a sealant, as shown in FIG. 3, when a UV light source 9 is positioned directly above, a CF (color filter) substrate 11 may be disposed on a upper side, a TFT (array) substrate 10 may be disposed on a lower side, and a UV mask 8 may be disposed over the CF substrate 11 to shield a A/A region (an effective display region, a A/A region for short) and expose a region coated with the sealant, namely a C region in FIG. 3, so that the sealant 6 is cured by using a UV curing equipment 9.

In general, in a structure shown in FIG. 3, a part of the TFT substrate 10 that correspond to the C region may reflect a small amount of UV light into the A/A region, thereby influencing liquid crystal. Therefore, a covering region of the used UV mask needs to exceed the A/A region such that a boundary of the covering region of the UV mask is located within a region between a outer side of the A/A region and an inner side of the sealant 6. A region between the boundary of the covering region of the UV mask and the outer side of the A/A region is an edge region M shown in FIG. 3. This can ensure that the UV light will not illuminate the A/A region.

Figure 4:
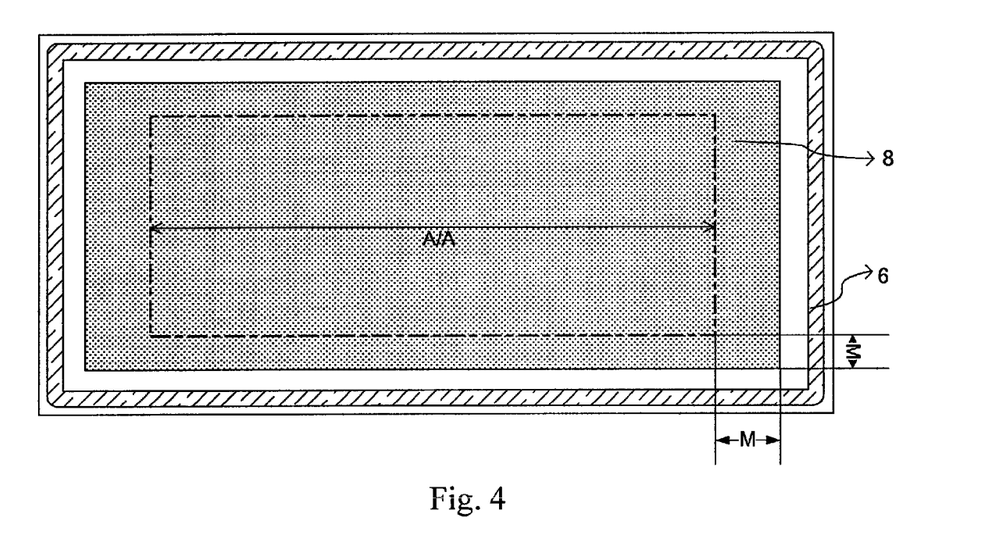
FIG. 4 is a layout of a existing UV mask.

FIG. 4 shows a layout of a current UV mask, wherein a shaded part is the covering region 8 of the UV mask including a display region corresponding to the A/A region and an edge region M. As can be seen from the figure, a boundary of the covering region 8 of the UV mask is located in a region between an outer side of the A/A region and an inner side of the sealant 6. As shown in FIG. 4, the edge region M is located in the region between the outer side of the A/A region and the inner side of the sealant 6, and a boundary line of the edge region M that is close to the A/A region is coincide with a boundary line of the A/A region.

In order to solve the high manufacturing cost problem of the display device caused by a special mask used for manufacturing a UV mask in prior art, embodiments of the present invention utilizes a existing mask used for the mass production in prior art to manufacture the UV mask. In embodiment of the present invention, a UV light-shielding layer is formed on a base substrate by using a color filter layer mask and a black matrix mask. Alternatively, the UV light-shielding layer is formed on the base substrate by the color filter layer mask. A covering region of the base substrate is designed to comprise a display region corresponding to the effective display region (the A/A region) in a display panel and an edge region M surrounding the display region. A boundary line of the edge region M that is close to the display region coincides with a boundary line of the display region and when the display region is positioned to align with the effective display region in the display panel, the edge region is positioned between the effective display region of the display panel and the sealant.

According to embodiments of the present invention, manufacturing way of the UV mask may vary according to different practical application circumstances. Specifically, there are the following two application circumstances.

Figure 5:
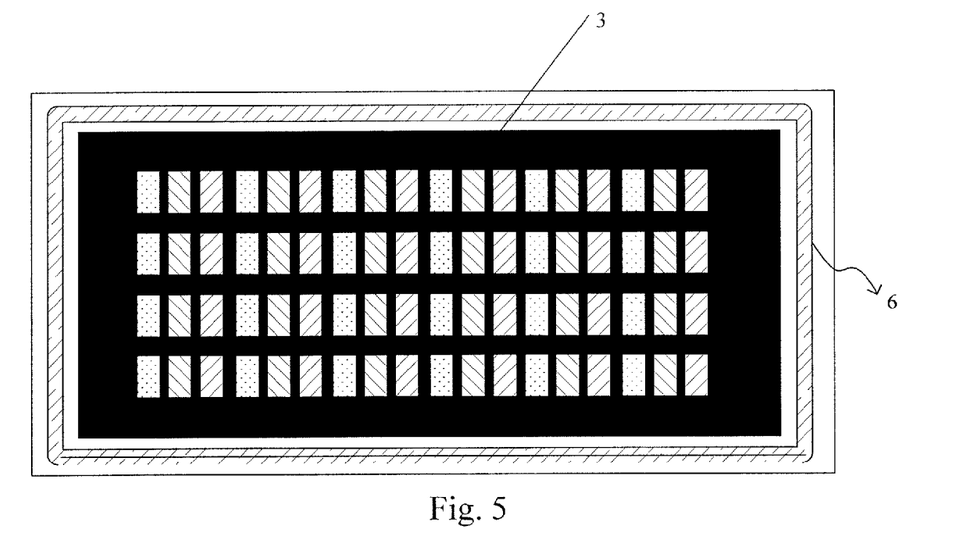
FIG. 5 is a structural schematic view of a CF structure.

In a first application circumstance, a CF structure shown in FIG. 5 is used wherein a boundary of a BM (black matrix) 3 is positioned inside the sealant 6. In this case, when the UV light source is positioned directly above, a CF substrate 11 may be disposed on an upper side, a TFT substrate 10 may be disposed on a lower side; or, the CF substrate 11 may be disposed on the lower side, the TFT substrate 10 may be disposed on the upper side.

Figure 6:
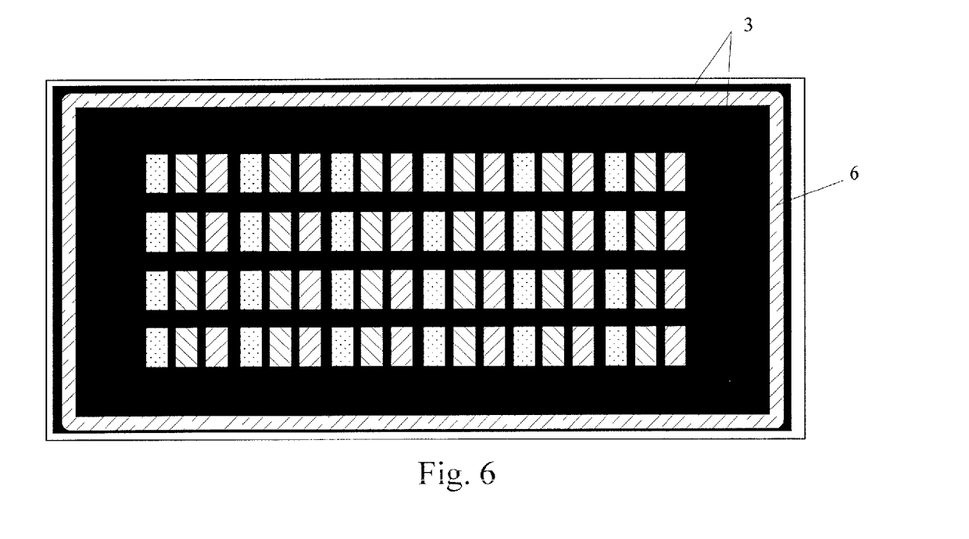
FIG. 6 is another structural schematic view of a CF structure.

In a second application circumstance, a CF structure shown in FIG. 6 is used, wherein a boundary of the BM 3 is positioned outside the sealant 6. When the UV light source is positioned directly above, if the CF substrate 11 is placed on the upper side, UV light may be absorbed by the BM 3 and can not be transmitted, so the sealant 6 can not be cured. Therefore, in this case, the CF substrate 11 is positioned only on the lower side and the TFT substrate 10 is positioned only on the upper side.

Figure 7:
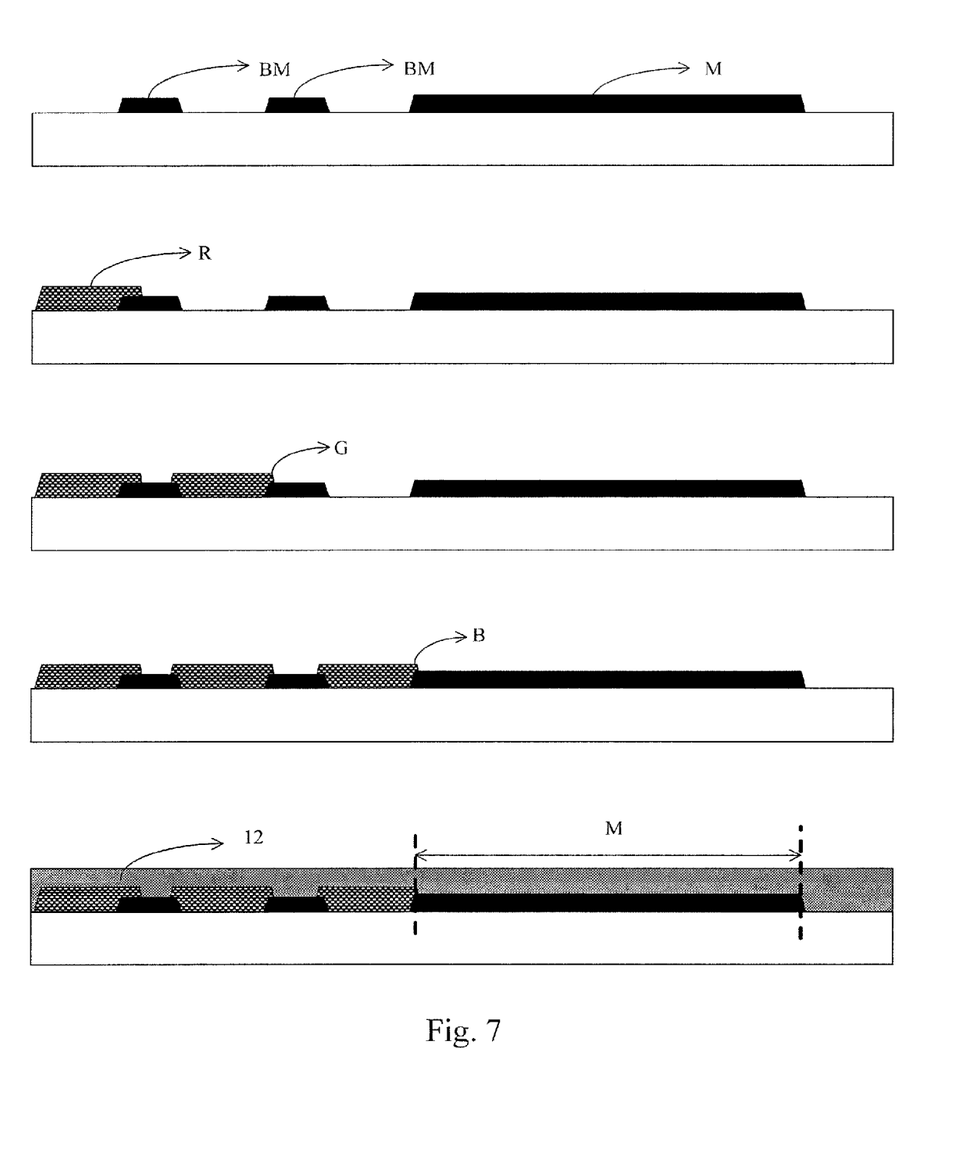
FIG. 7 is a schematic diagram of a UV mask manufacturing method for an application circumstance in FIG. 5.

FIG. 7 shows a schematic diagram of a manufacturing method for the UV mask for the first application circumstance according to an embodiment of the present invention. The manufacturing method includes the following steps.

Firstly, a covering region of a surface of the base substrate to be used to manufacture the UV mask is divided into a display region corresponding to the A/A region of the display panel and an edge region M surrounding the display region. Furthermore, the display region is divided into a black matrix region and a pixel region that is further divided into a red (R) pixel region, a green (G) pixel region and a blue (B) pixel region.

Then, a UV light-shielding layer is formed on the covering region, comprising:

1. Forming a Pattern of a First UV Light-Shielding Layer.

The pattern of the first UV light-shielding layer is formed on the base substrate which includes a pattern corresponding to the black matrix in the effective display region and a pattern of the edge region M.

In this step, the pattern corresponding to the black matrix in the A/A region and the pattern of the edge region M are formed with a existing black matrix mask (a BM mask). For example, during fabrication, a black light-shielding resin material may be used, or an opaque metal material may be used to form it.

2. Forming a Pattern of a Second UV Light-Shielding Layer.

The forming the second UV light-shielding layer includes forming a pattern corresponding to the pixel region in the A/A region on the base substrate, specifically, forming patterns corresponding to a red color filter layer (the R pixel region), a green color filter layer (the G pixel region) and a blue color filter layer (the B pixel region) on the base substrate by a red color filter layer mask, a green color filter layer mask and a blue color filter layer mask. In an embodiment of the present invention, a exiting red color filter layer mask is used to form the pattern of the R pixel region, a existing green color filter layer mask is used to form the pattern of the G pixel region, and a existing blue color filter layer mask is used to form the pattern of the B pixel region.

Figure 8:
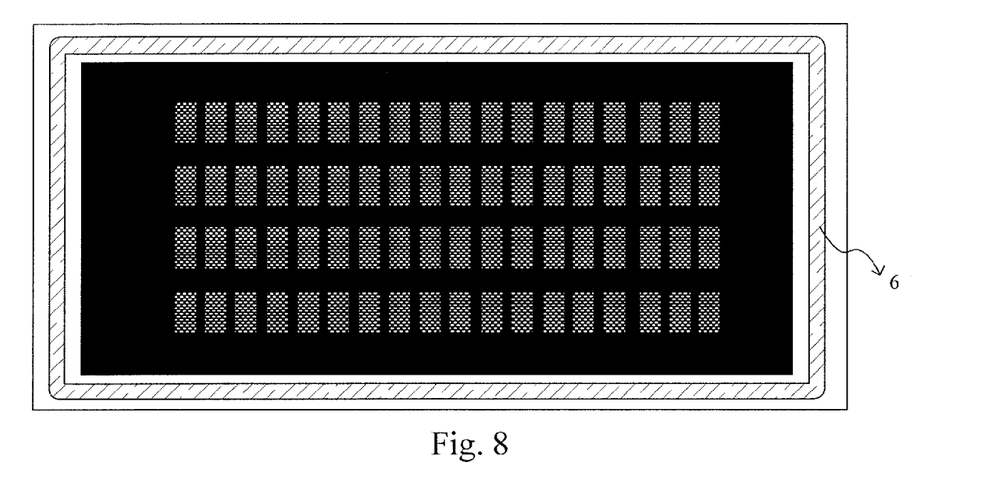
FIG. 8 is a top view of a UV mask formed by a process of FIG. 7.

The forming the UV mask is completed by the above-mentioned process. FIG. 8 shows a top view of the completed UV mask by using the process shown in FIG. 7. The above-mentioned first UV light-shielding layer and the second UV light-shielding layer are made of opaque material, such as, opaque resin, for example, resin used to fabricate the BM of the CF substrate may be utilized; or opaque metal, such as opaque metal used to fabricate the TFT substrate may be used. Thicknesses of the first UV light-shielding layer and the second UV light-shielding layer may be identical or may not be equal. For example, the thickness of the UV mask obtained by the manufacturing method according to an embodiment of the present invention is set such that transmittance of UV light is less than 5%.

For example, an overcoat layer 12 may be further formed on a surface of the completed UV mask to protect the UV mask.

Figure 9:
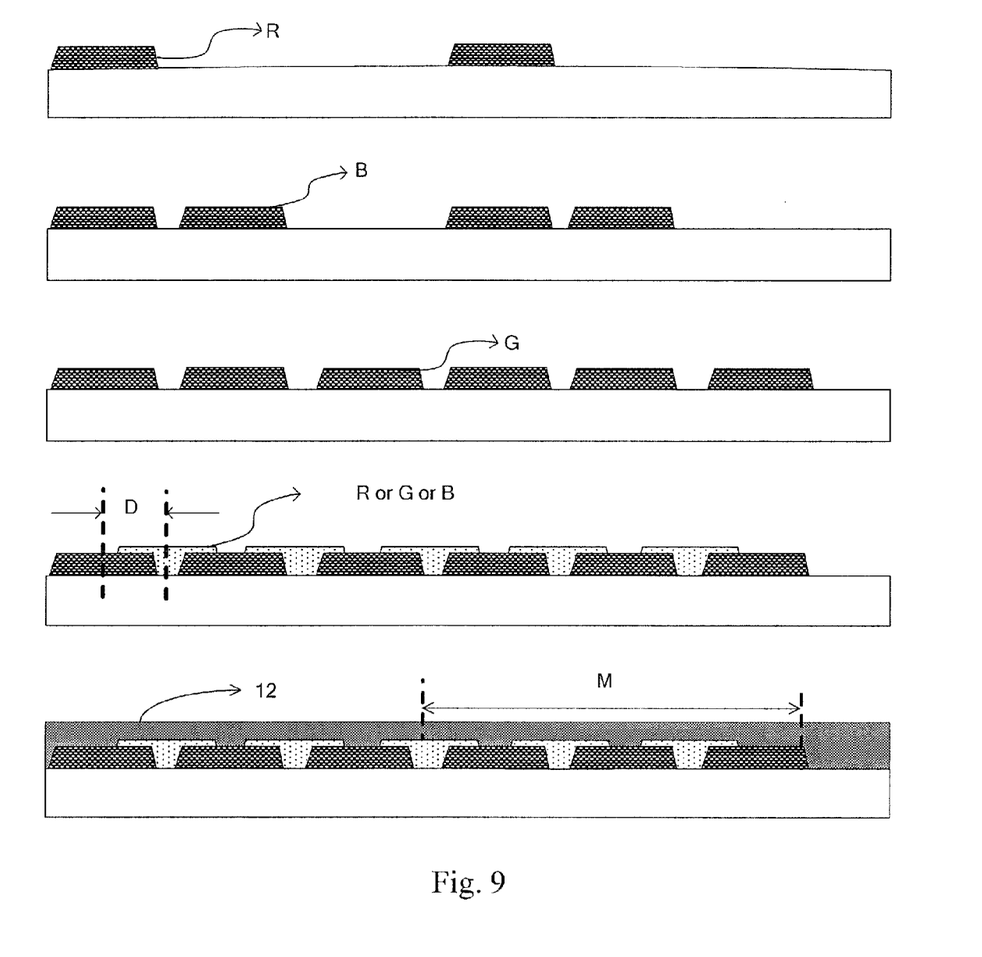
FIG. 9 is a schematic diagram of a UV mask manufacturing method for an application circumstance in FIG. 6.

FIG. 9 shows a schematic diagram of a manufacturing method for a UV mask suitable for the second application circumstance according to another embodiment of the present invention. The manufacturing method includes:

Firstly, a covering region of a surface of a base substrate for fabricating the UV mask is divided into a plurality of sub-regions arranged in order along a gate line direction of the display panel. For example, each of the sub-regions includes a first region, a second region and a third region arranged in order along the gate line direction. The first region, second region and third region all include an edge region M.

Then, a UV light-shielding layer is formed on the base substrate by a color filter layer mask. For example, the forming the UV light-shielding layer may include:

1. A Pattern of a First UV Light-Shielding Layer is Formed.

The pattern of the first UV light-shielding layer is formed on the base substrate and a pattern including the first region, the second region and the third region is formed by a patterning process. In an embodiment of the present invention, it may includes in order forming a pattern of the first region with a existing red mask, forming a pattern of the second region with a existing green mask, and forming a pattern of the third region with a existing blue mask.

The above-mentioned patterns of the first region, the second region and the third region may be a red pixel region, a green pixel region and a blue pixel region in order. Of course, an order may be changed and is not limited herein.

In addition, the patterns of the first region, the second region and the third region may be formed by using one of the red mask, the green mask and the blue mask. Generally, on the array substrate, the RGB pixels are of the same size. Therefore, the patterns of the first region, the second region and the third region may be formed by moving the one of the red mask, the green mask and the blue mask by a certain distance.

2. A Pattern of a Second UV Light-Shielding Layer is Formed.

The pattern of the second UV light-shielding layer is formed in gaps between the pattern of the first region, the pattern of the second region and the pattern of the third region on the base substrate.

In the process of fabricating the first UV light-shielding layer, due to parameter setting of an exposure process, relatively large gaps may exist between any two of the pattern of the first region, the pattern of the second region and the pattern of the third region. At the same time, generally, when fabricating the R, G and B masks of the color filter substrate in an original predetermined order, certain gaps may exist between pixel regions for forming the pattern of the BM. Therefore, the pattern of the second UV light-shielding layer needs to be formed in regions corresponding to the above-mentioned gaps. The first region, the second region and the third region herein include a part positioned in the edge region M. For example, by taking a position during forming the pattern of the first UV light-shielding layer as a reference position, after moving the red mask or the blue mask or the green mask along the gate line direction of the display panel by a predetermined distance D, the pattern of the second UV light-shielding layer is formed in the gaps between any two of the pattern of the first region, the pattern of the second region and the pattern of the third region.

For example, in order to ensure that the pattern of the second UV light-shielding layer can completely cover the above-mentioned gaps, the distance D may be a half of a pitch between the pattern of the first region, the pattern of the second region or the pattern of the third region along the gate line direction.

Figure 10:
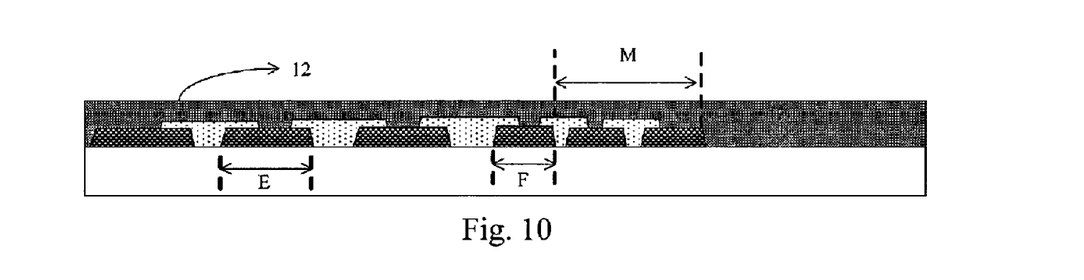
FIG. 10 is another schematic diagram of a UV mask manufacturing method for an application circumstance in FIG. 6.

It is to be noted that as shown in FIG. 9, the pattern of the first region, the pattern of the second region and the pattern of the third region have an equal size. However, they may also not be equal in sizes. As shown in FIGS. 10, E and F both represent different widths of the pattern of the first region, the pattern of the second region and the pattern of the third region in the display region and the edge region along the gate line direction. Magnitudes of E and F mainly depend on a design size of a pixel unit, and those skilled in the art can choose it according to the design size of the pixel unit.

Figure 11:
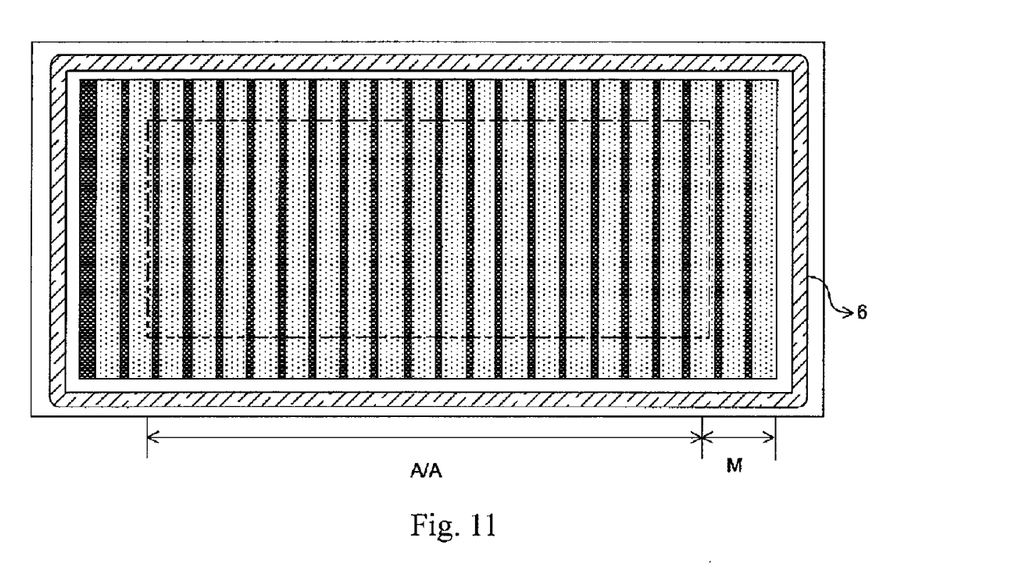
FIG. 11 is a top view of a UV mask formed by a process of FIG. 9.

The fabrication of the UV mask is completed by the above-mentioned process. FIG. 11 shows a top view of the completed UV mask by the process shown in FIG. 9. The above-mentioned first UV light-shielding layer and the second UV light-shielding layer are made of opaque material. For example, opaque resin such as resin used for manufacturing the BM of the CF substrate may be used; or, opaque metal such as opaque metal used for manufacturing the TFT substrate may be used. The first UV light-shielding layer and the second UV light-shielding layer may have equal or unequal thicknesses. For example, the thickness of the UV mask obtained by the manufacturing method according to an embodiment of the present invention is set such that transmittance of UV light is less than 5%.

For example, an overcoat layer 12 may be further formed on a surface of the completed UV mask to protect the UV mask.

Figure 12:
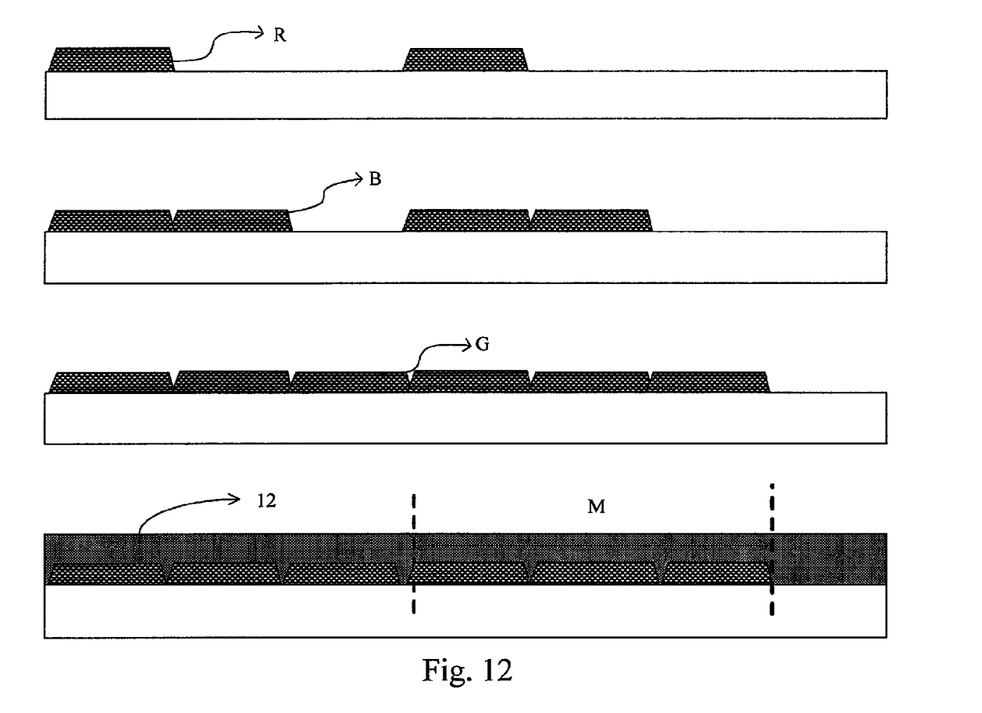
FIG. 12 is another schematic diagram of a UV mask manufacturing method for an application circumstance in FIG. 6.
Figure 13:
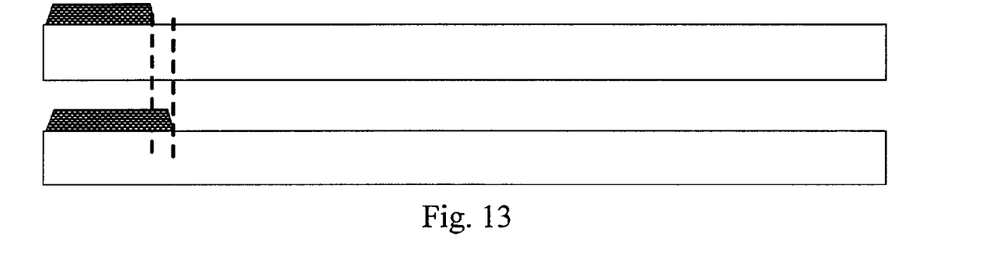
FIG. 13 is a schematic diagram of sizes of a R pixel region or a G pixel region or a B pixel region in FIGS. 9 and 12.

The manufacturing method for the UV mask shown in FIG. 9 may be modified. As shown in FIG. 12, one variation of the manufacturing method of FIG. 9 includes:

Firstly, a covering region of a surface of a base substrate for fabricating the UV mask is divided into a plurality of sub-regions arranged in order along a gate line direction. For example, each of the sub-regions includes a first region, a second region and a third region arranged in order along the gate line direction of the display panel. The first region may be a red pixel region, the second region may be a green pixel region and the third region may be a blue pixel region. An edge region M may also be included in the first region, the second region and the third region and it is possible to control size of the edge region M by moving the R, g and B mask by a certain distance.

Then, a UV light-shielding layer is formed on the base substrate. For example, patterns including the first region, the second region and the third region may be formed in turn by a patterning process. In this process, by adjusting parameters of an exposure process, the pattern of the first region, the pattern of the second region and the pattern of the third region may be joined seamlessly. In this variation, an exiting red mask may be used to form the pattern of the first region, a existing green mask may be used to form the pattern of the second region, and a existing blue mask may be used to form the pattern of the third region.

Of course, one of the red, green and blue masks may be used. In this case, by adjusting parameters of the exposure process, the pattern of the first region, the pattern of the second region and the pattern of the third region may be joined seamlessly, thus the fabrication of the UV mask is accomplished with one process.

Figure 14:
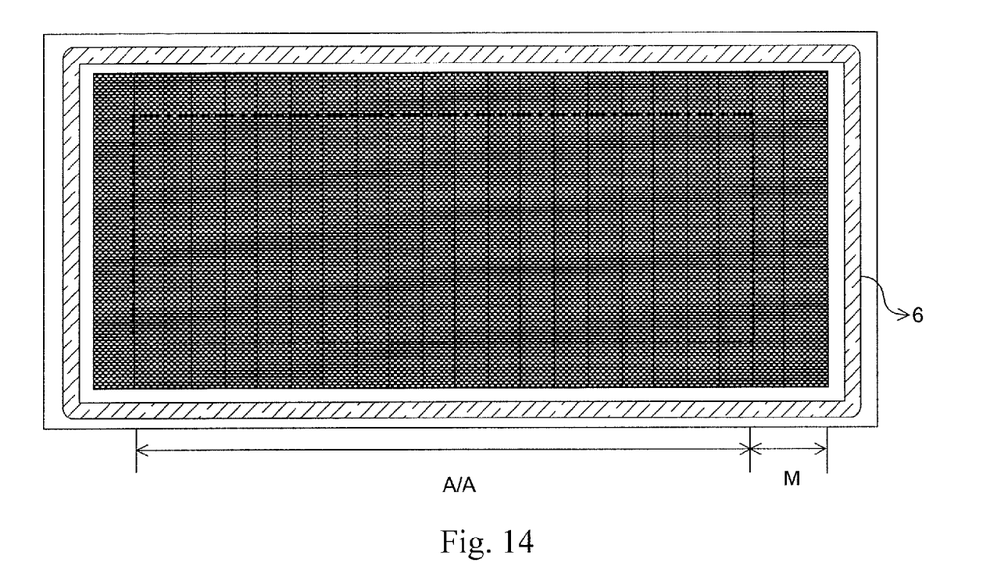
FIG. 14 is a top view of a UV mask formed by a process of FIG. 12.

The above-mentioned method is also applicable to the fabrication of high resolution panels. For a high resolution product, a pixel size is relatively small in a certain area, which can be realized by adjusting parameters of the exposure process, such as by lowering exposure amount. FIG. 14 shows a top view of the UV mask formed by the process shown in FIG. 12.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The application claims priority to the Chinese patent application No. 201310097951.0 filed on Mar. 25, 2013, which is incorporated herein by reference in its entirety.

The invention claimed is:

1. A manufacturing method of a UV mask, the UV mask used for UV curing a sealant in a display panel, and the method comprises:
   forming a UV light-shielding layer on a covering region of a base substrate by using a color filter layer mask and a black matrix mask; or, forming a UV light-shielding layer on the base substrate by the color filter layer mask;
   wherein the base substrate on which the UV light-shielding layer is formed is hanged over the display panel;
   wherein the covering region of the base substrate is configured to include a display region corresponding to an effective display region in the display panel and an edge region surrounding the display region; a boundary line of the edge region that is close to the display region coincides with a boundary line of the display region, and under a case in that the display region is positioned to align with the effective display region of the display panel, the edge region is positioned between the effective display region of the display panel and the sealant;

wherein the forming the UV light-shielding layer on the base substrate by a color filter layer mask comprises:

forming a pattern of a first UV light-shielding layer, wherein a pattern of a first region, a pattern of a second region and a pattern of a third region are formed on the covering region of the base substrate by at least one of a red color filter layer mask, a green color filter layer mask and a blue color filter layer mask;

forming a pattern of a second UV light-shielding layer, wherein the second UV light-shielding layer is formed in gaps between the pattern of the first region, the pattern of the second region and the pattern of the third region on the base substrate by the red color filter layer mask or the green color filter layer mask or the blue color filter layer mask.

2. The manufacturing method of a UV mask according to claim 1, further comprises:

dividing the covering region of the base substrate into a plurality of sub-regions arranged along a gate line direction of the display panel, and dividing each of the sub-regions into a first region, a second region and a third region arranged in order along the gate line direction.

3. The manufacturing method of a UV mask according to claim 1, wherein the forming a pattern of a second UV light-shielding layer in gaps between the pattern of the first region, the pattern of the second region and the pattern of the third region on the base substrate by the red color filter layer mask or the green color filter layer mask or the blue color filter layer mask comprises:

by taking a position during forming the pattern of the first UV light-shielding layer as a reference position, after moving the red color filter layer mask or the green color filter layer mask or the blue color filter layer mask along the gate line direction of the display panel by a predetermined distance, the pattern of the second UV light-shielding layer is formed in the gaps between the pattern of the first region, the pattern of the second region and the pattern of the third region.

4. The manufacturing method of a UV mask according to claim 3, wherein the predetermined distance is a half of a pitch between the pattern of the first region, the pattern of the second region and the pattern of the third region along the gate line direction.

5. The manufacturing method of a UV mask according to claim 1, wherein the pattern of the first region, the pattern of the second region and the pattern of the third region have equal or unequal distances along the gate line direction.

6. The manufacturing method of a UV mask according to claim 1, wherein the UV light-shielding layer is made of opaque resin or opaque metal material.

7. The manufacturing method of a UV mask according to claim 1, wherein an overcoat layer is formed on an entire surface of the base substrate to cover and protect the UV light-shielding layer.

8. A manufacturing method of a UV mask, the UV mask used for UV curing a sealant in a display panel, and the method comprises:

forming a UV light-shielding layer on a covering region of a base substrate by using a color filter layer mask and a black matrix mask; or, forming a UV light-shielding layer on the base substrate by the color filter layer mask;

wherein the base substrate on which the UV light-shielding layer is formed is hanged over the display panel;

wherein the covering region of the base substrate is configured to include a display region corresponding to an effective display region in the display panel and an edge region surrounding the display region; a boundary line of the edge region that is close to the display region coincides with a boundary line of the display region, and under a case in that the display region is positioned to align with the effective display region of the display panel, the edge region is positioned between the effective display region of the display panel and the sealant;

wherein the forming the UV light-shielding layer on the base substrate by a color filter layer mask comprises:

forming a pattern of a first UV light-shielding layer on the base substrate by using at least one of a red color filter layer mask, a green color filter layer mask and a blue color filter layer mask, the pattern of the first UV light-shielding layer including a pattern of a first region, a pattern of a second region and a pattern of a third region, wherein during forming the pattern of the first UV light-shielding layer, parameters of an exposure process are adjusted such that the pattern of the first region, the pattern of the second region and the pattern of the third region are joined seamlessly.

9. The manufacturing method of a UV mask according to claim 8, wherein the pattern of the first region, the pattern of the second region and the pattern of the third region have equal or unequal distances along the gate line direction.

10. The manufacturing method of a UV mask according to claim 8, wherein the UV light-shielding layer is made of opaque resin or opaque metal material.

11. The manufacturing method of a UV mask according to claim 8, wherein an overcoat layer is formed on an entire surface of the base substrate to cover and protect the UV light-shielding layer.

* * * * *